(12) United States Patent
Chen (10) Patent No.: US 8,920,002 B2
(45) Date of Patent: Dec. 30, 2014

(54) WIRE-CLASPING LIGHT-EMITTING DIODE LIGHTS

(75) Inventor: Johnny Chen, Sindian (TW)

(73) Assignee: Willis Electric Co., Ltd., Taipei (TW)

( * ) Notice: Subject to any disclaimer, the term of this patent is extended or adjusted under 35 U.S.C. 154(b) by 535 days.

(21) Appl. No.: 13/165,472

(22) Filed: Jun. 21, 2011

(65) Prior Publication Data

US 2012/0327658 A1 Dec. 27, 2012

(51) Int. Cl.
*F21V 3/00* (2006.01)
*F21V 5/00* (2006.01)
*H01L 33/62* (2010.01)
*H01L 33/48* (2010.01)

(52) U.S. Cl.
CPC ....... *H01L 33/62* (2013.01); *H01L 2224/48247* (2013.01); *H01L 33/483* (2013.01)
USPC ... 362/311.02; 257/99; 257/675; 362/249.02; 439/890

(58) Field of Classification Search
USPC .......... 257/99, 676; 362/249.02, 311.02, 646, 362/659, 800; 439/890
See application file for complete search history.

(56) References Cited

U.S. PATENT DOCUMENTS

| | | | |
|---|---|---|---|
| 3,233,207 A | 2/1966 | Ahroni et al. |
| 3,728,787 A | 4/1973 | McDonough |
| 4,045,868 A | 9/1977 | Ammon et al. |
| 4,631,650 A | 12/1986 | Ahroni |
| 4,712,299 A | 12/1987 | Loewen et al. |
| 4,779,177 A | 10/1988 | Ahroni |
| 4,807,098 A | 2/1989 | Ahroni |
| 4,870,753 A | 10/1989 | Pfeffer et al. |
| 4,899,266 A | 2/1990 | Ahroni |
| 4,934,964 A | 6/1990 | Mazelle |
| 5,073,132 A | 12/1991 | Nottrott |
| 5,109,324 A | 4/1992 | Ahroni |
| 5,121,310 A | 6/1992 | Ahroni |
| 5,217,382 A | 6/1993 | Sparks |
| 5,218,233 A | 6/1993 | Takahashi |
| 5,607,328 A | 3/1997 | Joly |
| 5,624,283 A | 4/1997 | Hotea |
| 5,653,616 A | 8/1997 | Hotea |
| 5,822,855 A | 10/1998 | Szczesny et al. |

(Continued)

FOREIGN PATENT DOCUMENTS

CN 201187701 1/2009
EP 0 552 741 A2 7/1993

(Continued)

*Primary Examiner* — Stephen F Husar
(74) *Attorney, Agent, or Firm* — Christensen Fonder P.A.

(57) ABSTRACT

A lead frame for a light-emitting diode (LED). The lead frame includes a first lead and a second lead. Each lead includes a top portion and an integrated wire-clasping portion. The first and second top portions each angle away from the center of the lead frame to form an increasingly larger gap between the two leads. The wire-clasping portions of each lead initially lie in a common plane and are adjacent one another. After securing the wire to the wire-clasping portions of the lead frame, the leads of the lead frame are rotated or twisted approximately 90 degrees such that the wire-clasping portions of the leads are opposite one another, rather than lying in the same plane. The wires and attached lead frame are inserted into a lampholder, the lampholder recesses receiving the top tabs of the lead frame and holding the wires and lead frame in place.

23 Claims, 6 Drawing Sheets

(56) References Cited

U.S. PATENT DOCUMENTS

| | | |
|---|---|---|
| 5,829,865 A | 11/1998 | Ahroni |
| 6,079,848 A | 6/2000 | Ahroni |
| 6,095,874 A | 8/2000 | Quaranta |
| 6,120,312 A | 9/2000 | Shu |
| 6,139,376 A | 10/2000 | Ooya et al. |
| 6,147,367 A | 11/2000 | Yang et al. |
| 6,363,607 B1 | 4/2002 | Chen et al. |
| 6,533,437 B1 | 3/2003 | Ahroni |
| 6,609,814 B2 | 8/2003 | Ahroni |
| 6,666,734 B2 | 12/2003 | Fukatsu |
| 7,137,854 B2 | 11/2006 | Casses et al. |
| 7,140,928 B1 | 11/2006 | Jacques et al. |
| 7,226,323 B2 | 6/2007 | Noro et al. |
| 7,575,362 B1 | 8/2009 | Hsu |
| 8,562,175 B2 * | 10/2013 | Chen ................ 362/249.02 |
| 2002/0109989 A1 | 8/2002 | Chuang |
| 2003/0096542 A1 | 5/2003 | Kojima |
| 2003/0142494 A1 | 7/2003 | Ahroni |
| 2004/0004435 A1 | 1/2004 | Hsu |
| 2008/0007951 A1 | 1/2008 | Chan |
| 2008/0186731 A1 | 8/2008 | Graham |
| 2008/0205020 A1 | 8/2008 | Vich |
| 2008/0307646 A1 | 12/2008 | Zaderej et al. |
| 2009/0002991 A1 | 1/2009 | Huang |
| 2011/0215368 A1 | 9/2011 | Chen |

FOREIGN PATENT DOCUMENTS

| | | |
|---|---|---|
| EP | 0 727 842 A2 | 8/1996 |
| GB | 1150390 | 4/1969 |
| GB | 1245214 | 9/1971 |
| WO | WO 91/10093 | 7/1991 |
| WO | WO 96/24966 | 8/1996 |
| WO | WO 2009/115860 | 9/2009 |

* cited by examiner

WIRE-CLASPING LIGHT-EMITTING DIODE LIGHTS

FIELD OF THE INVENTION

The present invention is generally directed to light-emitting diode (LED) lights. More specifically, the present invention is directed to LED lead frames that are mechanically-connectable to wires.

BACKGROUND OF THE INVENTION

Light-emitting diode (LED) lamps provide a source of illumination for a variety of lighting applications, including decorative lighting, automotive lighting, architectural lighting, and other such applications. Depending on the particular application, LED chips may be packaged in a number of different ways to form the LED lamp. However, most conventional LED lamps are formed of an LED chip mounted to a lead-frame structure and encapsulated in an epoxy resin lens.

Conventional lead frames include a pair of leads, or electrodes, one to serve as the anode, the other as the cathode. An LED chip is mounted to the upper portion of the cathode, and a wire bond forms an electrical connection between the LED chip and the upper portion of the anode. When a proper voltage is applied to the electrode pair, current flows through the LED, and light is produced.

Such conventional lead frames are formed by a mechanical stamping process, with the lower portion of the leads consisting of narrow metallic strips which, when mounted in the LED lamp project perpendicularly away from the lens. Such leads may have a square or rectangular cross-section such that they form post-like structures. This type of lead frame works well when the LED lamp is to be inserted into a circuit board or connected to a panel-like support structure.

However, for those applications requiring that the LED leads be coupled to an insulated conductor, such as a decorative light string, rather than, for example, a trace on a printed circuit board, connecting the leads of conventional LED lead frames to electrical wiring poses significant challenges. In some cases, the leads may be soldered directly to ends of the conductor to form a connection. In other cases, intermediate structures, such as wire terminals, or mechanical connectors, may be used.

Commonly, wire terminals are manufactured in a stamping process separate from the stamping of the lead frames. Thus, an extra step in manufacture is often required. In such an application, the wire terminals must be separately crimped to make the required mechanical connections to the ends of the conductors. Where a wire terminal is not properly secured to a conductor, an air gap can result, thus leading to undesired electrical arcing and detrimental effects to the electrical components. Also, as briefly mentioned above, in applications where soldering is used, not only is the process more arduous, but numerous problems can arise, like cold-solder joints.

In any case dealing with LED lead frames and insulated wiring, it can be difficult to make the aforementioned electrical or mechanical connections, with the result being unreliable and inconsistent electrical and mechanical connection between the lead frame and the wiring. Such difficulties drive up the cost of manufacture and installation, and potentially decrease the safety of the lighting product.

SUMMARY OF THE INVENTION

According to an embodiment, the present invention is a lead frame for a light-emitting diode (LED). The lead frame includes a first or anode lead and a second cathode lead. Each lead includes a top portion and an integrated wire-clasping portion. The first and second top portions each angle away from the center of the lead frame to form an increasingly larger gap between the two leads. The wire-clasping portions of each lead initially lie in a common plane and are adjacent one another.

In an embodiment, each of the wire-clasping portions of the leads includes a middle portion, bottom tabs, middle tabs, and top tabs. The top tabs include angled sides such that the tab forms a generally triangular shape. The middle tabs may be slightly wider than the bottom tabs. In other embodiments, only two sets of tabs may be used, such as top and middle, or middle and top.

In another embodiment of the present invention, the invention is an LED assembly that includes the LED lead frame, an LED attached to the lead frame, lens, and lampholder. The lampholder includes a pair of slots for receiving the triangular or trapezoidal top tabs and holding them securely in the lampholder.

Each of the bottom tabs may be bent to clasp the insulation of a wire. Each of the middle tabs may be bent to clasp both the insulation of the wire and the conductor of the wire. The top of the middle tabs press against the conductors, forcing them toward the top tabs, thereby creating an electrical connection between the conductors and the wire-clasping portions of the LED lead frame.

In an embodiment, after securing the wire to the wire-clasping portions of the lead frame, the leads of the lead frame are rotated or twisted approximately 90 degrees such that the wire-clasping portions of the leads are opposite one another, rather than lying in the same plane. The wires and attached lead frame are inserted into the lampholder, the lampholder recesses receiving the top tabs of the lead frame and holding the wires and lead frame in place.

In another embodiment of the present invention, the leads of the lead frame are not twisted. In this embodiment of the lead frame, the wire-clasping portions of the lead frame are separated by a middle portion. Initially, the entire lead frame lies in the same plane. During assembly, two bends are placed in the middle portion of the lead frame such that the two wire-clasping portions of each lead are opposite one another and spaced a distance apart. The wire-clasping portions of the leads are attached to insulated wires and locked into the lampholder in a manner similar to that of the embodiments described above.

In another embodiment, the present invention comprises a wire-clasping lead frame for an LED that includes a first lead including a top portion coupled to a substantially flat wire-clasping portion, the wire-clasping portion defining a first plane having a middle portion and a first tab a second tab extending orthogonally from the middle portion, and a second lead including a top portion coupled to a substantially flat wire-clasping portion, the wire-clasping portion defining a second planed and having a middle portion and a first tab and a second tab extending orthogonally from the middle portion. The wire-clasping portion of the first lead is opposite the wire-clasping portion of the wire-clasping portion of the second lead such that the first plane and the second plane are substantially parallel.

According to an embodiment of the present invention, a feature and advantage of the present invention is that integrated wire-clasping portions can be manufactured in the same plane as the rest of the lead frame. For example, the wire-clasping portion for the anode lead lies adjacent and in the same plane as the anode lead. Similarly, the wire-clasping portion for the cathode lead lies adjacent and in the same plane as the cathode lead. And, both wire-clasping portions are adjacent and in the same plane as the other. Such a configuration greatly aids in reducing manufacturing time and cost because a single mechanical stamping process can be used to generate both the leads as well as the wire-clasping portions.

Another feature and advantage of the present invention is that one fewer connection is required. In the current art, when a terminal is utilized, two connections must be made; one from the conductor to the terminal, and one from the terminal to the LED lead frame. According to an embodiment of the present invention, a single, direct electrical connection is made between the LED lead frame and the conductor. In the present invention, the lead LED lead frame is electrically connected to the conductors via the integrated wire-clasping portions' connection to the conductors by action of the middle and top tabs pressing against the conductor of the wire. Thus, the chance of unreliable or inconsistent electrical and mechanical connections between the lead frame and the wiring are greatly reduced. No secondary connection is required to connect the lead frame to the wire-clasping portions.

As such, an embodiment of the present invention comprises an LED illumination assembly that includes a wire-clasping LED lead frame including a first lead and a second lead, the first lead having a top portion affixed to a wire-clasping portion and the second lead having a top portion affixed to a wire-clasping portion; an LED chip mounted to, and in electrical connection with, the top portion of the first lead, and in electrical connection with the top portion of the second lead; a lens encapsulating a portion of the top portion of the first lead, and a portion of the top portion of the second lead and the LED chip; a first wire having an insulator and a conductor; and a second wire having an insulator and a conductor. The wire-clasping portion of the first lead clasps the first wire to form a mechanical and electrical connection and the wire-clasping portion of the second lead clasps the second wire to form a mechanical and electrical connection to the second wire.

In another embodiment, the present invention comprises a decorative light string that includes an electrical power plug configured to receive power from an external power source and a plurality of LED illumination assemblies. Each of the LED illumination assemblies includes a wire-clasping LED lead frame including a first lead and a second lead, the first lead having a top portion affixed to a wire-clasping portion and the second lead having a top portion affixed to a wire-clasping portion, the wire-clasping portion of the first lead clasping a first wire to form a mechanical and electrical connection and the wire-clasping portion of the second lead clasping a second wire to form a mechanical and electrical connection to the second wire; an LED chip mounted to, and in electrical connection with, the top portion of the first lead, and in electrical connection with the top portion of the second lead; and a lens encapsulating a portion of the top portion of the first lead, a portion of the top portion of the second lead and the LED chip. Each of the plurality of LED illumination assemblies is in electrical communication with the other and with the electrical power plug.

Another feature and advantage of the present invention is that the first and second top portions of each of the anode and cathode leads each angle away from the center of the lead frame to form an increasingly larger gap between the two leads, thus allowing for the integrated wire-clasping portions. The horizontal offset created by the length and angle from the center of the lead frame of the first and second top portions provides room to place effective wire-clasping portions immediately adjacent the lead frame leads.

Another feature and advantage of the present invention is that the bottom tabs, middle tabs, and top tabs of the wire-clasping portions form an integrated system for effectively contacting and remaining in contact with the conductor of a wire. As described above, each of the bottom tabs may be bent to clasp the insulation of a wire. Each of the middle tabs may be bent to clasp both the insulation of the wire and the conductor of the wire. The top of the middle tabs press against individual strands of the conductors, forcing them toward the top tabs, thereby creating an electrical connection between the conductors and the wire-clasping portions of the LED lead frame. Thus, the extra surface area and clasping ability of the top and middle tabs, along with the insulation-clasping bottom tabs ensure a consistent, strong, and lasting connection between the wire-clasping portion and the conductor, and therefore, the terminal and the LED lead frame, when compared to wire-clasping portions having a simple one-wing-contact design.

Another feature and advantage of the present invention is that the top tabs of the wire-clasping portions allow a wedged, angled fit into the retaining slot of an LED lamp assembly. Such a fit provides additional support to the electrical connection as well as to the LED lead frame, thus ensuring a consistent, stable, and sound connection between the conductor to the the wire-clasping portions, the wire-clasping portions in support of the lead frame, and the lead frame itself within the LED lamp assembly housing once the wire-clasping portions and wires are seated.

Another feature and advantage of the present invention is that the intermediate assembly of an LED lead frame positioned within an LED lamp assembly is more structurally consistent and stable than the current art. A wide gap between lead frames, as well as a lens and cover assembly that hold the distance between lead frame first and second top portions fixed once the lead frame is inserted into the lampholder, wherein the lampholder recesses receives the top tabs of the lead frame and holds the wires and lead frame in place allow for a stable LED lead frame assembly.

The above summary of the various representative embodiments of the invention is not intended to describe each illustrated embodiment or every implementation of the invention. Rather, the embodiments are chosen and described so that others skilled in the art can appreciate and understand the principles and practices of the invention. The figures in the detailed description that follow more particularly exemplify these embodiments.

BRIEF DESCRIPTION OF THE DRAWINGS

The invention can be understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

Figure 1A:
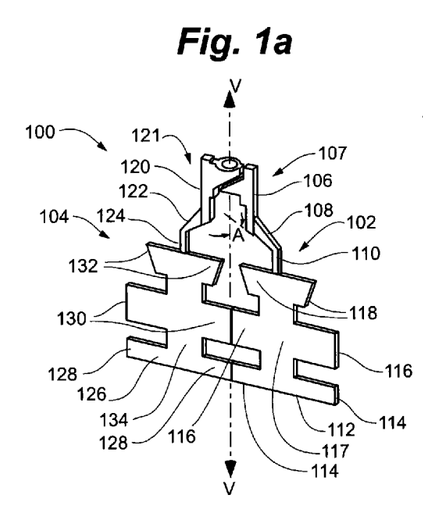
FIG. 1a is perspective view of an LED lead frame assembly with a top portion and an integrated wire-clasping portion according to an embodiment of the present invention.

Referring to FIG. 1a, an embodiment of a wire-clasping light emitting diode lead frame 100 of the present invention is depicted. Wire-clasping light emitting diode lead frame 100 includes a first or anode lead 102 and a second or cathode lead 104.

First lead 102 includes a top portion 107 and a wire-clasping portion 112. Top portion 107 includes post 106, angling arm 108, and twistable support 110. Post 106 provides one-half of the electrode pair of the traditional LED assembly. Post 106 is connected at the end distal the LED chip to a first end of angling arm 108. Angling arm 108 provides a length such that first lead 102 angles away from the center of the lead frame, depicted by axis V, to form an angle A, and an increasingly larger gap between first and second leads 102 and 104. Angle A may range from 0 degrees to 90 degrees, depending in part upon a desired width of the wire-clasping portions as described below. In an embodiment, angle A may range from 15 degrees to 60 degrees. In another embodiment, angle A is substantially 45 degrees.

A first end of twistable support 110 is connected to a second end of angling arm 108. Twistable support 110 may be oriented in a plane that is parallel to the outer edge of post 106. A second end of twistable support 110 is connected to wire-clasping portion 112.

In an embodiment, wire-clasping portion 112 includes a middle portion 117, bottom tabs 114, middle tabs 116, and top tabs 118. Middle portion 117 extends along the length of wire-clasping portion 112. Bottom tabs 114, middle tabs 116, and top tabs 118 all extend substantially orthogonally from middle portion 117. A first bottom tab 114 extends from one side of middle portion 117 and a second bottom tab 114 extends from the opposite side of middle portion 117. Similarly, a first middle tab 116 extends from one side of middle portion 117 and a second middle tab 116 extends from the opposite side of middle portion 117. Finally, a first top tab 118 extends from one side of middle portion 117 and a second top tab 118 extends from the opposite side of middle portion 117.

Top tabs 118 are located along middle portion 117 at the end immediately adjacent the connection of twistable support 110 to wire-clasping portion 112. Bottom tabs 114 are located along middle portion 117 at the end distal the connection of twistable support 110 to wire-clasping portion 112. Middle tabs 116 are located along middle portion 117 at a point intermediate bottom tabs 114 and top tabs 118.

Bottom tabs 114 and middle tabs 116 are substantially rectangular. Middle tabs 116 may be slightly wider than bottom tabs 114. In an embodiment, top tabs 118 include angled sides such that the combination of top tabs 118 forms a generally triangular shape.

Second lead 104 includes a top portion 121 and a wire-clasping portion 126. Top portion 121 includes anvil 120, angling arm 122, and twistable support 124. Anvil 120 provides the other half of the electrode pair of the traditional LED assembly, along with post 106. Anvil 120 is connected at the end distal the LED chip to a first end of angling arm 122. Angling arm 122 provides a length such that second lead 104 angles away from the center of the lead frame to form an increasingly larger gap between first and second leads 102 and 104. A first end of twistable support 124 is connected to a second end of angling arm 122. Twistable support 124 may be oriented in a plane that is parallel to the outer edge of anvil 120. A second end of twistable support 124 is connected to wire-clasping portion 126.

In an embodiment, wire-clasping portion 126 includes a middle portion 134, bottom tabs 128, middle tabs 130, and top tabs 132. Middle portion 134 runs the length of wire-clasping portion 126. Bottom tabs 128, middle tabs 130, and top tabs 132 all extend substantially orthogonally from middle portion 134. A first bottom tab 128 extends from one side of middle portion 134 and a second bottom tab 128 extends from the opposite side of middle portion 134. Similarly, a first middle tab 130 extends from one side of middle portion 134 and a second middle tab 130 extends from the opposite side of middle portion 134. Finally, a first top tab 132 extends from one side of middle portion 134 and a second top tab 132 extends from the opposite side of middle portion 134.

Top tabs 132 are located along middle portion 134 at the end immediately adjacent the connection of twistable support 124 to wire-clasping portion 126. Bottom tabs 128 are located along middle portion 134 at the end distal the connection of twistable support 124 to wire-clasping portion 126. Middle tabs 130 are located along middle portion 134 at a point intermediate bottom tabs 128 and top tabs 132.

Bottom tabs 128 and middle tabs 130 may be substantially rectangular. Middle tabs 130 may be slightly wider than bottom tabs 128. Top tabs 132 include angled sides such that the combination of top tabs 132 forms a generally triangular shape.

In an embodiment, twistable supports 110 and 124 may be substantially the same length such that wire-clasping portions 112 and 126 are generally adjacent one another, rather than offset along a vertical axis. As will be discussed further below, this feature allows lead frame 100 to be used with standard-length lampholders, rather than causing a long-length lampholder to be used to accommodate a vertical offset between wire-clasping portions 112 and 126.

Figure 1B:
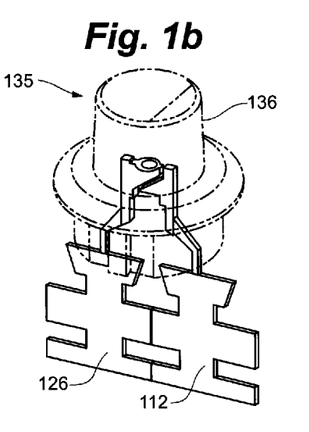
FIG. 1b is a perspective view of the LED lead frame assembly of FIG. 1a with a lens and cover assembly fitted over the LED lead frame assembly to form a lamp.
Figure 1E:
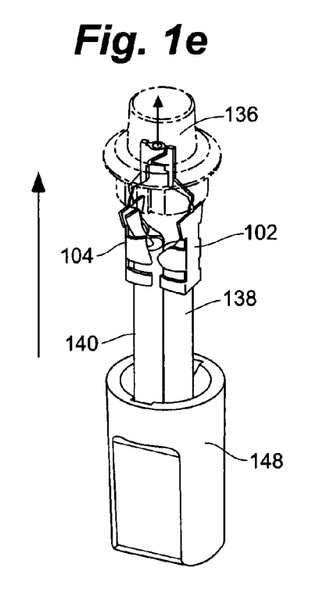
FIG. 1e is a perspective view of the LED lead frame assembly of FIG. 1d with a lampholder assembly placed around the insulated electrical wires in an assembly configuration.
Figure 1F:
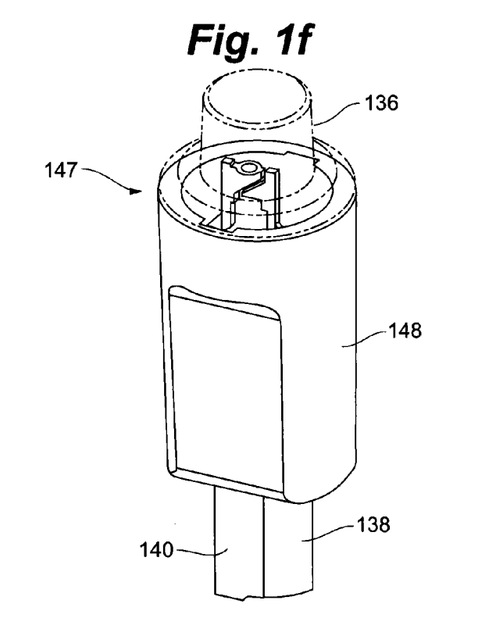
FIG. 1f is a perspective view of the LED lead frame assembly of FIG. 1e in an operational configuration of a clasping LED assembly.
Figure 2:
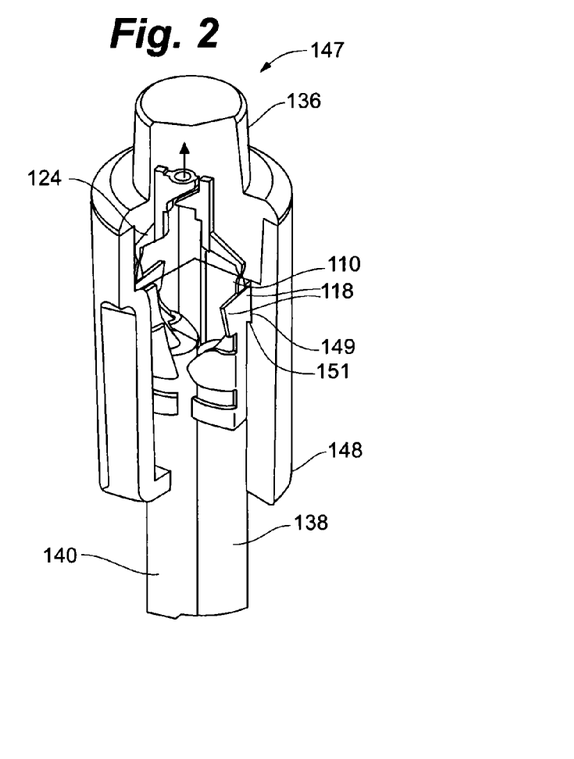
FIG. 2 is a perspective cut-away view of the LED lead frame assembly and clasping LED assembly of FIG. 1f.

Referring to FIG. 1b, in another embodiment of the present invention, lamp 135 is depicted. Lamp 135 includes an LED chip, LED lead frame 100, and lens 136. Referring also to FIGS. 1e-1f and FIG. 2, in another embodiment of the present invention, a lamp assembly that includes lamp 135, lampholder 148, and, a first electrical wire 138 having insulation 142 and conductor 144, and a second electrical wire 140 having insulation 146 and conductor 148 with an appropriate power source operably coupled to wires 138 and 140 is depicted.

Several of the above-described components have notable interrelationships. For example, the angle at which angling arm 108 and angling arm 122 project from the center of lead frame 100 to form angle A is in a direct relationship with the gap between first and second leads 102 and 104. As a result, angling arms 108 and 122 are directly related to the width of wire-clasping portions 112 and 126. A more obtuse angle A formed by angling arm 108 with post 106 allows for less width for wire-clasping portion 112 than a more acute angle. Likewise, a more obtuse angle A formed by angling arm 122 with anvil 120 allows for less width for wire-clasping portion 126 than a more acute angle.

Additionally, the aforementioned angles of angling arms 108 and 122 and, hence, the gap between first lead 102 and second lead 104, are interrelated with the gauge of wire being utilized. For example, a larger gauge wire will generally require a wire-clasping portion of greater width than a smaller gauge wire. In order to make a secure connection, clasping tabs of each wire-clasping portion 112 and 126 must extend such that they are able to wrap sufficiently around a portion of the circumference of the insulation and conductor, as discussed above. A larger gauge wire has a larger relative circumference than a smaller gauge wire, therefore requiring clasping tabs of greater length. Thus, the gap between first lead 102 and second lead 104 can be adjusted depending on the gauge of wire being used. In operation, to generate a clasping LED assembly in a lightable, operational configuration, the steps depicted in FIGS. 1b-f are considered. Referring again to FIG. 1a, light emitting diode lead frame 100 is depicted in an initial assembly configuration, soon after mechanical stamping and subsequent addition of the other components that make up the light assembly, like the LED chip and wire bond. The wire-clasping portions 112 and 126 of first lead 102 and second lead 104 initially lie in a common plane and are adjacent one another.

Referring to FIG. 1b, a lens or cover assembly 136 is positioned over LED lead frame 100 to form lamp 135. The body of lens 136 extends from the cover of lens 136 such that first lead 102 top portion 107 and second lead 104 top portion 121 are housed substantially within the body of lens 136. First lead 102 wire-clasping portion 112 and second lead 104 wire-clasping portion 126 remain substantially outside of the body of lens 136.

Figure 1C:
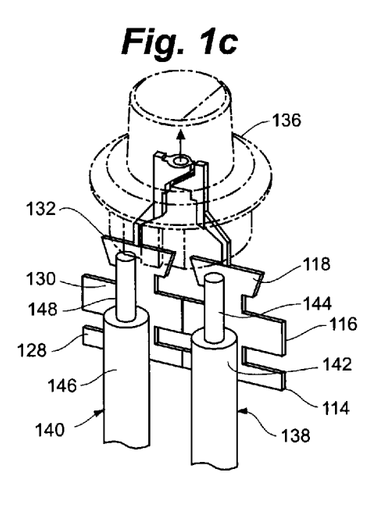
FIG. 1c is a perspective view of the LED lead frame assembly of FIG. 1b positioned adjacent two insulated electrical wires.

Referring to FIG. 1c, the combination lens 136 and light emitting diode lead frame 100 assembly as lamp 135 is positioned adjacent electrical wires 138 and 140. Lamp 135 is positioned such that first lead 102 wire-clasping portion 112 bottom tabs 114 are substantially adjacent insulation 142 of first wire 138 and subsequently claspable to insulation 142. First lead 102 wire-clasping portion 112 middle tabs 116 are positioned adjacent both insulation 142 and a portion of conductor 144. The top of conductor 144 is positioned substantially adjacent and parallel with the top of first lead 102 wire-clasping portion 112 top tabs 132. Similarly, the assembly is positioned such that second lead 104 wire-clasping portion 126 bottom tabs 128 are substantially adjacent insulation 146 of second wire 140 and subsequently claspable to insulation 146. Second lead 104 wire-clasping portion 126 middle tabs 130 are positioned adjacent both insulation 146 and a portion of conductor 148. The top of conductor 148 is positioned substantially adjacent and parallel with the top of second lead 104 wire-clasping portion 126 top tabs 132.

Figure 1D:
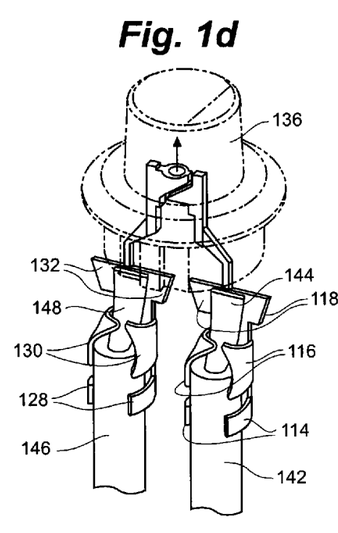
FIG. 1d is a perspective view of the LED lead frame assembly of FIG. 1c with the wire-clasping portions coupled to the insulated electrical wires.

Referring to FIG. 1d, each of first lead 102 wire-clasping portion 112 bottom tabs 114 are bent to clasp the insulation 142 of first wire 138. Each of first lead 102 wire-clasping portion 112 middle tabs 116 are bent to clasp both the insulation 142 of first wire 138 and the conductor 144 of first wire 138. The top of the middle tabs 116 press against the conductor 144, forcing the conductor 144 towards the first lead 102 wire-clasping portion 112 top tabs 118, thereby creating an electrical connection between the first lead 102 and the first wire 138. Similarly, each of second lead 104 wire-clasping portion 126 bottom tabs 128 are bent to clasp the insulation 146 of second wire 140. Each of the second lead 104 wire-clasping portion 126 middle tabs 130 are bent to clasp both the insulation 146 of the second wire 140 and the conductor 148 of second wire 140. The top of the middle tabs 130 press against the conductor 148, forcing the conductor 148 towards the second lead 104 wire-clasping portion 126 top tabs 132, thereby creating an electrical connection between the second lead 104 and the second wire 140.

In some embodiments wherein conductors 144 and 148 comprise multiple strands of conductive material, the tops of middle tabs 130 are bent so as to impart a force in the direction of the leads 102 or 104 onto the multiple strands of conductive material causing the strands to spread or fan out, thereby further increasing the area of wire conductors contacting leads 102 and 104.

In addition to the benefit of increased conductive contact between leads 102 and 104 and their respective wires 138 and 140 created by the unique clasping of the wires is an improved mechanical connection between the leads and the wires. Rather than merely clamp solely onto an insulation portion, or solely to a conductor portion of a wire, middle tabs 116 and 130 clasp both the insulators and conductors of wires 138 and 140. The angled bending of middle tabs 116 and 130 over the perpendicular faces and corresponding edges of insulations 142 and 146 prevents wires 138 and 140 from moving along the face of wire-clasping portions 112 and 126 in an upward direction, towards lens 136. In addition to clasping wires 138 and 140, the portions of bent tabs 116 and 130 block wires 138 and 140 from moving in the upward or vertical direction, thusly improving the mechanical connection.

In an embodiment, any of the aforementioned tabs wrap at least halfway around the circumference of the conductor or insulation, respectively, as is appropriate. In another embodiment, any of the aforementioned tabs can extend and subsequently wrap such that they overlap with the tab opposite the respective middle portion. For example, first bottom tab 114, middle portion 117, and second bottom tab 114 may extend such that the combined continuous transverse length of first bottom tab 114, middle portion 117, and second bottom tab 114 have a length greater than the circumference of insulation 142 of wire 138. In such a configuration, first bottom tab 114 and second bottom tab 114 may then overlap each other.

Referring to FIG. 1e, after securing the wires 138 and 140 to the wire-clasping portions 112 and 126 of the lead frame 100, first lead 102 and second lead 104 are rotated or twisted approximately 90 degrees in opposite directions. First lead 102 is rotated about the axis formed by first wire 138 in a clockwise direction. Second lead 104 is rotated about the axis formed by second wire 140 in a counterclockwise direction. Shown in a twisted state in FIG. 1e, first lead 102 wire-clasping portion 112 and second lead 104 wire-clasping portion 126 are opposite one another in substantially parallel planes, rather than lying in the same plane. Thus, wire-clasping portion 112 is orthogonal to its original assembly position. Likewise, wire-clasping portion 126 is orthogonal to its original assembly position.

Referring to FIG. 2, twistable support 110 is shown in a twisted state, easily discernable because of the cut-away section of lampholder 148. Likewise, twistable support 124 is shown in a twisted state behind lens 136. Prior to, or after the rotation of each lead is performed, a lampholder can be inserted onto wires 138 and 140 to house the lead frame 100.

Referring also to FIG. 1f and FIG. 2, lampholder 148 is in a fixed, operational configuration after having been positioned adjacent lens 136 and subsequently secured to form clasping LED assembly 147. Lampholder 148 is provided with appropriate recesses such that a respective outer side of lens 136 makes flush contact with a respective inner side of lampholder 148. Further, the appropriate recesses provide support orthogonal to the respective outer side of lens 136 by allowing a respective bottom side of lens 136 to rest on a ledge enabled by the respective recesses.

Referring again to FIG. 2, additional lampholder 148 recesses or slots 149 are configured to receive the top tabs 118 and 132 of the respective leads to thereby hold the wires and LED lead frame 100 in place. In an embodiment, tab recesses 149 run throughout the length of the circumference of a respective inner side of lampholder 148 so that LED lead frame 100 can be secured in any circumferential position relative to lampholder 148. In another embodiment, tab recesses 149 are designed on opposing sides of lampholder 148 such that LED lead frame 100 can be secured in only one circumferential position. The interior dimensions of lampholder 148 and appropriate recesses are shaped such that the outside sides of middle portions 117 and 134 make flush contact with lampholder 148. An interfacing edge of top tabs 118 and 132 rests on a ledge 151 enabled by the respective recesses to provide support for that tab's lead, and therefore, support entire LED lead frame 100.

The securing of twisted wire-clasping portions 112 and 126 slots 151 prevents accidental contact between leads 102 and 104, and thus short-circuiting of LED, and does not require that a vertical offset between wire-clasping portions be present to avoid such short-circuiting. Further, the elimination of a vertical offset between wire-clasping portions allows for the use of standard-length lampholders, and does not require that the lampholder length be extended to encompass all conducting portions of the lead frame.

The aforementioned angles of angling arms 108 and 122 and, hence, the gap between first lead 102 and second lead 104, are further interrelated with the particular circumference of lampholder 148 that is utilized. Because of the aforementioned fit of top tabs 118 and 124 of the respective leads 102 and 104 into the aforementioned recesses of lampholder 148, consideration must be paid to extend angling arms 108 and 122, and therefore, the planes of middle portions 117 and 134, respectively, to make contact with the interior dimensions of lampholder 148. As such, the gap between first lead 102 and second lead 104 is adjustable further relative to the circumference of the particular lampholder 148 desired. Therefore, LED lead frame 100 is adaptable to any number of lampholders 148. Referring to FIGS. 1a-1f, devices and methods of assembling a clasping LED assembly is depicted. In FIG. 1a, a wire-clasping LED lead frame 100 having a first or anode lead 102 and a second or cathode lead 104 is provided.

Referring to FIG. 1b, lens 136 is positioned over LED lead frame 100 to form lamp 135. Lens 135 may form an encapsulation, such as a molded lens, over the top portion of first lead 102 and second lead 104. In another embodiment, lens 135 may be inserted over the top portions of leads 102 and 104 into recesses formed in lens 135.

Lamp 135 is then positioned, as depicted in FIG. 1c, such that first wire 138 is substantially adjacent first lead 102 wire-clasping portion 112, and second wire 140 is substantially adjacent second lead 104 wire-clasping portion 126.

Next, referring to FIG. 1d, each of first lead 102 wire-clasping portion 112 bottom tabs 114 are bent to clasp the insulation 142 of first wire 138. Each of first lead 102 wire-clasping portion 112 middle tabs 116 are bent to clasp both the insulation 142 of first wire 138 and the conductor 144 of first wire 138. The top of the middle tabs 116 press against the conductor 144, forcing the conductor 144 towards the first lead 102 wire-clasping portion 112 top tabs 118. Each of second lead 104 wire-clasping portion 126 bottom tabs 128 are bent to clasp the insulation 146 of second wire 140. Each of the second lead 104 wire-clasping portion 126 middle tabs 130 are bent to clasp both the insulation 146 of the second wire 140 and the conductor 148 of second wire 140. The top of the middle tabs 130 press against the conductor 148, forcing the conductor 148 towards the second lead 104 wire-clasping portion 126 top tabs 132.

Referring to FIG. 1e, first lead 102 and second lead 104 are rotated or twisted 90 degrees in opposite directions. First lead 102 is rotated about the axis formed by first wire 138 in a clockwise direction. Second lead 104 is rotated about the axis formed by second wire 140 in a counterclockwise direction. Lampholder 148 is threaded over wires 138 and 140 and further threaded towards lens 136 to house LED lead frame 100.

Referring to FIG. 1f, clasping LED assembly 147 is formed by securing lampholder 148 to lamp 135. Lampholder 148 recesses receive the top tabs 118 and 124 of the respective leads to thereby hold the wires and LED lead frame 100 in place.

Accordingly, in an embodiment, the present invention also includes s method of manufacturing a wire-clasping LED illumination assembly. The method includes providing an LED lead frame, the lead frame including a first lead having a top portion, an intermediate portion, and a wire-clasping portion with first and second bendable tabs, and a second lead having a top portion, an intermediate portion, and a wire-clasping portion with first and second bendable tabs, the wire-clasping portion of the first lead and the wire-clasping portion of the second lead defining an initial common plane; positioning a lens over a top portion of the first lead and over a top portion of the second lead, thereby securing the top portion of the first lead and the top portion of the second lead in a substantially fixed position relative to the lens; bending the first and second bendable tabs of the first lead about a first wire having a conductor and an insulator such that the first lead is in electrical contact with the conductor of the first wire; bending the first and second bendable tabs of the second lead about a second wire having a conductor and an insulator such that the second lead is in electrical contact with the conductor of the second wire; and twisting the intermediate portions of the first and second leads such that the wire-clasping portion of the first lead and the wire-clasping portion of the second lead define a first plane and a second plane.

Figure 3:
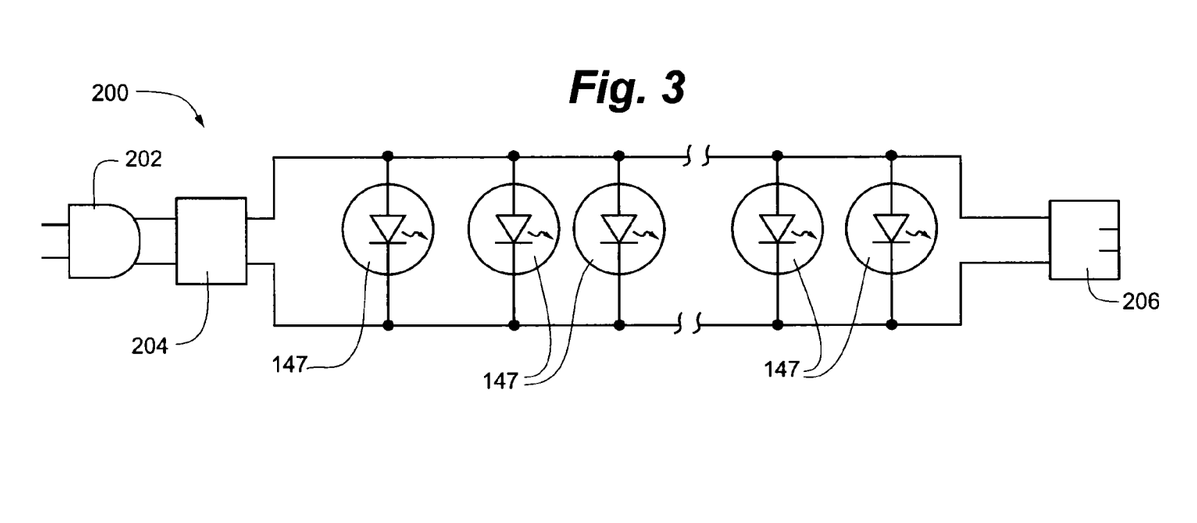
FIG. 3 is a parallel-configured block circuit diagram of a light string according to an embodiment of the present invention.

In another embodiment of the present invention, referring to FIG. 3, a parallel-configured block circuit diagram depicting light string 200 is shown. Light string 200 includes plug 202, optional power converter 204, end connector 206, and one or more clasping LED assemblies 147. Plug 202 is operably couplable to a power source or an end connector of a second light string containing a connection to a power source. Power converter 204 is operably coupled to plug 202 and provides converted power to LED assemblies 147 in a usable form. For example, power converter 204 may convert power from alternating current to direct current. One or more clasping LED assemblies 147 are operably coupled in parallel at intervals along light string 200. Wiring connects the plurality of LED assemblies 147. End connector 206 provides an interface for operably coupling a second light string and transferring the required power to the second string. As such, end connector 206 is operably coupled to the wiring along the parallel sequence of LED assemblies 147 and the input power source.

Figure 4:
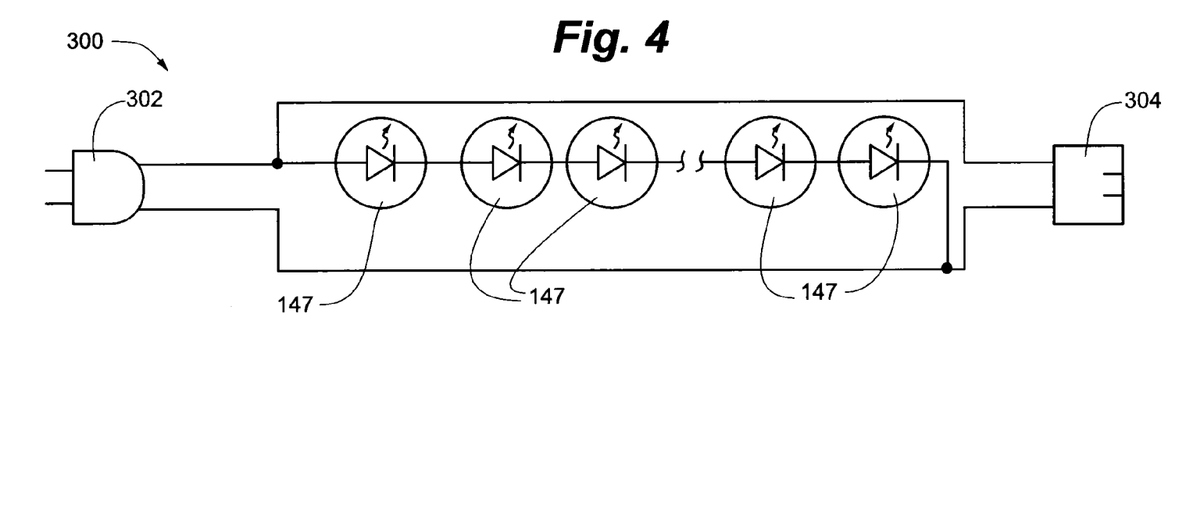
FIG. 4 is a series-configured block circuit diagram of a light string according to an embodiment of the present invention.

In another embodiment of the present invention, referring to FIG. 4, a series-configured block circuit diagram depicting light string 300 is shown. Light string 300 includes plug 302, end connector 304, and one or more clasping LED assemblies 147. Plug 304, like plug 202 in light string 200, may be operably coupled to a power source or an end connector of a second light string containing a connection to a power source. One or more clasping LED assemblies 147 are operably coupled in series at intervals along light string 300. Wiring connects the plurality of LED assemblies 147. End connector 304, like end connector 206 in light string 200, provides an interface for operably coupling a second light string and transferring the required power to the second string. Thus, end connector 304 is operably coupled to the wiring along the series sequence of LED assemblies 147 and the input power source.

One skilled in the art will appreciate that light string 200 and light string 300 are but two of the plurality of configurations of possible light strings. Any combination—with or without power converter 204, series, and/or parallel configurations, for example, are considered, including multiple series-configured strings connected in parallel to form a series-parallel-configured decorative light string.

Figure 5:
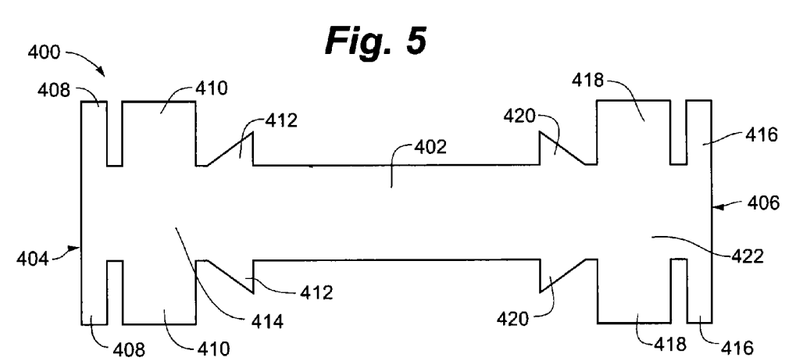
FIG. 5 is a top view of a bendable LED lead frame assembly with an integrated wire-clasping portion according to an embodiment of the present invention.

In another embodiment of the present invention, referring to FIGS. 5-8, the leads of the lead frame are bent or partially folded instead of twisted. Referring specifically to FIG. 5, the entire lead frame 400 initially lies in the same plane after mechanical stamping or after being otherwise formed. Wire-clasping portions 404 and 406 are positioned at opposite ends from each other along intermediate portion 402. Similar to the previously-described embodiments, each wire-clasping portion includes a number of clasping tabs.

Wire-clasping portion 404 includes a middle portion 414, bottom tabs 408, middle tabs 410, and top tabs 412. Middle portion 414 runs the length of wire-clasping portion 404 from the end of bottom tabs 408 to where top tabs 412 extend from middle portion 414. Bottom tabs 408, middle tabs 410, and top tabs 412 all extend substantially orthogonally from middle portion 414. A first bottom tab 408 extends from one side of middle portion 414 and a second bottom tab 408 extends from the opposite side of middle portion 414. Similarly, a first middle tab 410 extends from one side of middle portion 414 and a second middle tab 410 extends from the opposite side of middle portion 414. Finally, a first top tab 412 extends from one side of middle portion 414 and a second top tab 412 extends from the opposite side of middle portion 414.

At the other end of intermediate portion 402, wire-clasping portion 406 includes a middle portion 422, bottom tabs 416, middle tabs 418, and top tabs 420. Middle portion 422 runs the length of wire-clasping portion 406 from the end of bottom tabs 416 to the where top tabs 412 extend from middle portion 422. Bottom tabs 416, middle tabs 418, and top tabs 420 all extend substantially orthogonally from middle portion 422. A first bottom tab 416 extends from one side of middle portion 422 and a second bottom tab 416 extends from the opposite side of middle portion 422. Similarly, a first middle tab 418 extends from one side of middle portion 422 and a second middle tab 418 extends from the opposite side of middle portion 422. Finally, a first top tab 420 extends from one side of middle portion 422 and a second top tab 420 extends from the opposite side of middle portion 422.

Figure 6:
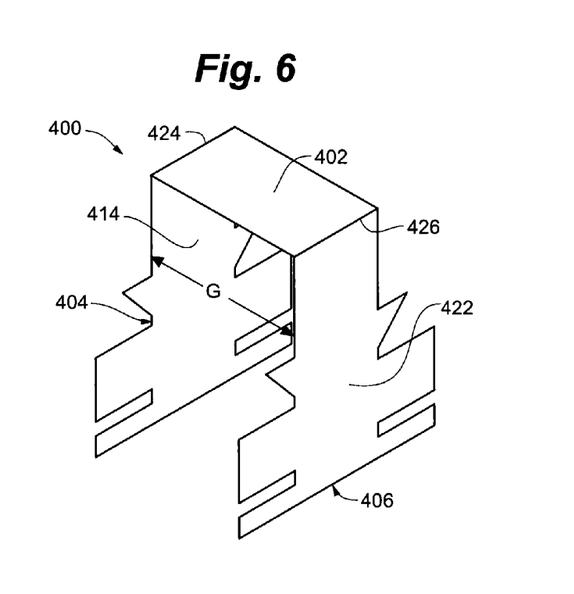
FIG. 6 is a perspective view of the LED lead frame of FIG. 5 in a bent position.

Referring to FIG. 6, during assembly, two bends are placed in intermediate portion 402 of lead frame 400 such that the two wire-clasping portions 404 and 406 of each lead are opposite one another and spaced a distance apart. As depicted in FIG. 6, a first lead is bent at bend 424 to extend wire-clasping portion 404 substantially orthogonally from intermediate portion 402. A second lead is bent at bend 426 to extend wire-clasping portion 406 substantially orthogonally from intermediate portion 402. In such a configuration, wire-clasping portions 404 and 406 are then opposite one another and spaced distance G apart. Thus, a gap G is created between the leads and the wire-clasping portions 404 and 406.

Figure 7:
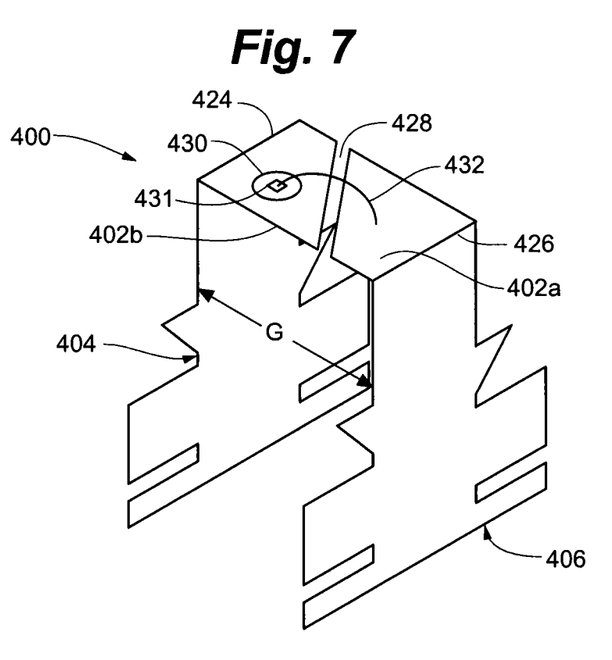
FIG. 7 is a perspective view of the LED lead frame of FIG. 6 with an LED chip and wire bond.

Referring to FIG. 7, an embodiment of lead frame 400 is depicted with an LED chip 430 carrier, LED chip 431, and wire bond 432 mounted to the now-separated intermediate portion 402. An aperture 428 is created along intermediate portion 402 to create two discrete leads, first lead 402a and second lead 402b. In conventional lead frames, the lead containing LED chip 431 is the cathode, and the opposite lead is the anode, wherein the wire bond 432 forms an electrical connection between LED chip 431 and the upper portion of the anode. In this embodiment, second lead 402b contains LED chip 431, and is bonded with wire bond 432 to first lead 402a.

Figure 8:
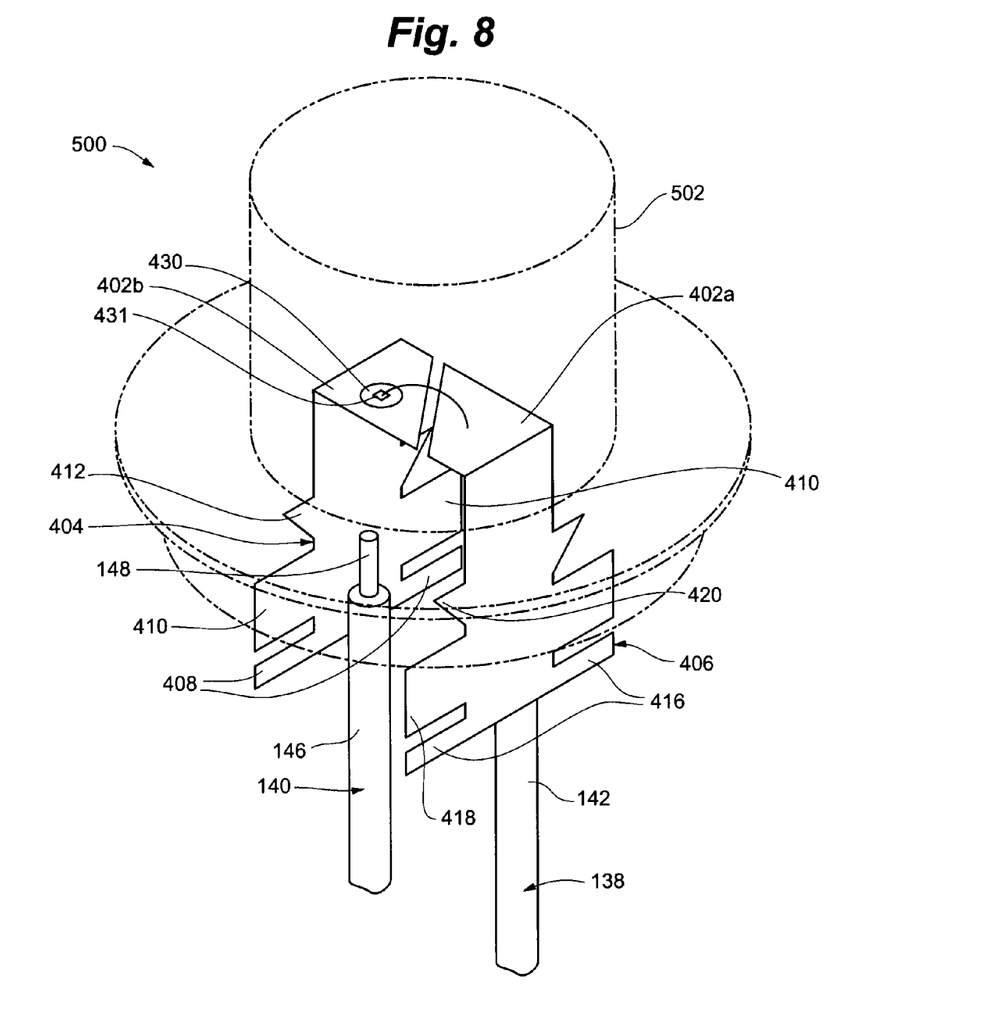
FIG. 8 is a perspective view of the LED lead frame of FIG. 7 with a lens and cover assembly fitted over the LED lead frame assembly to form a lamp, further positioned adjacent two insulated electrical wires.

Referring to FIG. 8, in another embodiment of the present invention, lamp 500 is depicted. Lamp 500 includes LED chip 430, LED lead frame 400, and lens 502. The body of lens 502 extends from the cover of lens 502 such that first lead 402a and second lead 402b are housed partially within the body of lens 502. Wire-clasping portion 404 and wire-clasping portion 406 remain substantially outside of the body of lens 502.

Lamp 500 is positioned adjacent electrical wires 138 and 140 similar to the embodiments described above. Lamp 500 is positioned such that wire-clasping portion 406 bottom tabs 416 are substantially adjacent insulation 142 of first wire 138 and subsequently claspable to insulation 142. Wire-clasping portion 406 middle tabs 418 are positioned adjacent both insulation 142 and a portion of conductor 144 (not shown). The top of conductor 144 is positioned substantially adjacent and parallel with the top of wire-clasping portion 406 top tabs 420. Similarly, the assembly is positioned such that bottom tabs 408 are substantially adjacent insulation 146 of second wire 140 and subsequently claspable to insulation 146. Wire-clasping portion 404 middle tabs 410 are positioned adjacent both insulation 146 and a portion of conductor 148. The top of conductor 148 is positioned substantially adjacent and parallel with the top of wire-clasping portion 404 top tabs 412.

In such an embodiment, the steps of wire-clasping to insulated wires 138 and 140 and attaching lampholder 148 to lamp 500 are the same as described with respect to FIGS. 1d-1f and FIG. 2 as described above.

The embodiments above are intended to be illustrative and not limiting. Additional embodiments are within the claims. In addition, although aspects of the present invention have been described with reference to particular embodiments, those skilled in the art will recognize that changes can be made in form and detail without departing from the spirit and scope of the invention, as defined by the claims.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A wire-clasping lead frame for a light-emitting diode (LED), comprising: a first lead including a top portion and a wire-clasping portion, the top portion having an anode portion and an extension, the wire-clasping portion affixed to the extension of the top portion and having a plurality of tabs for clasping a first wire having an insulator and a conductor; and a second lead including a top portion and a wire-clasping portion, the top portion having a cathode portion and an extension, the wire-clasping portion affixed to the extension of the top portion, the wire-clasping portion having a plurality of tabs for clasping a second wire having an insulator and a conductor; wherein the first lead is adjacent the second lead such that a first gap is formed between the anode portion and the cathode portion, and a second gap is formed between the extension of the top portion of the first lead and the extension of the top portion of the second lead;

wherein the wire-clasping portion of the first lead includes a middle portion, and the plurality of tabs of the wire-clasping portion of the first lead includes a bottom pair of tabs extending orthogonally from the middle portion and for clasping the insulation of the first wire, and includes a middle pair of tabs extending orthogonally from the middle portion and for clasping the insulation and the conductor of the first wire.

2. The wire-clasping lead frame of claim 1, wherein the wire-clasping portion of the first lead and the wire-clasping portion of the second lead are substantially flat and define a common plane.

3. The wire-clasping lead frame of claim 1, wherein the extension of the first lead includes an angling arm and a twistable support, the twistable support being attached to the wire-clasping portion of the first lead, and the extension of the second lead includes an angling arm and a twistable support, the twistable support being attached to the wire-clasping portion of the second lead.

4. The wire-clasping lead frame of claim 3, wherein the twistable support of the first lead and the twistable support of the second lead are twisted approximately 90 degrees such that a middle portion of the wire-clasping portion of the first lead forms a first plane that is substantially parallel to a second plane formed by a middle portion of the wire-clasping portion of the second lead.

5. The wire-clasping lead frame of claim 1, wherein the plurality of tabs of the wire-clasping portion of the first lead includes a top pair of tabs extending orthogonally from the middle portion and for contacting the conductor of the first wire.

6. A wire-clasping lead frame for a light-emitting diode (LED), comprising: a first lead including a top portion coupled to a substantially flat wire-clasping portion, the wire-clasping portion having a middle portion and a first tab and a second tab extending orthogonally from the middle portion; and a second lead including a top portion coupled to a substantially flat wire-clasping portion, the wire-clasping portion having a middle portion and a first tab and a second tab extending orthogonally from the middle portion; wherein the wire-clasping portion of the first lead is adjacent and opposite the wire-clasping portion of the wire-clasping portion of the second lead and the wire-clasping portions of the first and the second lead define a common plane;

wherein the wire-clasping portion of the first lead further has a third tab extending orthogonally from the middle portion and the wire-clasping portion of the second lead further has a third tab extending orthogonally from the middle portion.

7. The wire-clasping frame of claim 6, wherein the top portion of the first lead includes a post coupled to an angled extension, the extension coupled to the wire-clasping portion.

8. The wire-clasping LED lead frame of claim 7, wherein the angled extension angles away from a center of the lead frame thereby defining an angle between a central, vertical axis of the LED lead frame and the extension, the magnitude of the angle determined substantially by a width of the wire-clasping portion.

9. The wire-clasping LED lead frame of claim 8, wherein an angle formed between the central, vertical axis and the extension ranges from 15° and 60°.

10. A light-emitting diode (LED) illumination assembly, comprising: a wire-clasping LED lead frame including a first lead and a second lead, the first lead having a top portion affixed to a wire-clasping portion and the second lead having a top portion affixed to a wire-clasping portion; an LED chip mounted to, and in electrical connection with, the top portion of the first lead, and in electrical connection with the top portion of the second lead; a lens encapsulating a portion of the top portion of the first lead, and a portion of the top portion of the second lead and the LED chip; a first wire having an insulator and a conductor; and a second wire having an insulator and a conductor; wherein the wire-clasping portion of the first lead clasps the first wire to form a mechanical and electrical connection and the wire-clasping portion of the second lead clasps the second wire to form a mechanical and electrical connection to the second wire wherein the first lead and the second lead are twisted such that the wire-clasping portion of the first lead and the wire-clasping portion of the second lead are substantially opposite one another.

11. The LED illumination assembly of claim 10, further including a lampholder, the lampholder including a first slot receiving a pair of first tabs of the wire-clasping portion of the first lead, and a second slot receiving a pair of first tabs of the wire-clasping portion of the second lead.

12. The LED illumination assembly of claim 10, the wire-clasping portion of the first lead including a first pair of tabs contacting the conductor of the first wire and orthogonal to a middle portion of the wire-clasping portion of the first lead; and a second pair of tabs contacting both the conductor and insulator of the first wire.

13. The LED illumination assembly of claim 12, wherein at least a portion of each of the tabs of the second pair of tabs is bent towards a face of the wire-clasping portion of the first lead, and contacts the first conductor such that a bundle of individual strands of the first conductor is deformed, thereby increasing a contact surface area between the first conductor and the wire-clasping portion of the first lead.

14. A method of manufacturing a wire-clasping, light-emitting diode (LED) illumination assembly, comprising: providing an LED lead frame, the lead frame including a first lead having a top portion, an intermediate portion, and a wire-clasping portion with first and second bendable tabs, and a second lead having a top portion, an intermediate portion, and a wire-clasping portion with first and second bendable tabs, the wire-clasping portion of the first lead and the wire-clasping portion of the second lead defining an initial common plane; positioning a lens over a top portion of the first lead and over a top portion of the second lead, thereby securing the top portion of the first lead and the top portion of the second lead in a substantially fixed position relative to the lens; bending the first and second bendable tabs of the first lead about a first wire having a conductor and an insulator such that the first lead is in electrical contact with the conductor of the first wire; bending the first and second bendable tabs of the second lead about a second wire having a conductor and an insulator such that the second lead is in electrical contact with the conductor of the second wire; and twisting the intermediate portions of the first and second leads such that the wire-clasping portion of the first lead and the wire-clasping portion of the second lead define a first plane and a second plane.

15. A wire-clasping lead frame for a light-emitting diode (LED), comprising: a first lead including a top portion and a wire-clasping portion, the top portion having an anode portion and an extension, the wire-clasping portion affixed to the extension of the top portion and having a plurality of tabs for clasping a first wire having an insulator and a conductor; and a second lead including a top portion and a wire-clasping portion, the top portion having a cathode portion and an extension, the wire-clasping portion affixed to the extension of the top portion, the wire-clasping portion having a plurality of tabs for clasping a second wire having an insulator and a conductor; wherein the first lead is adjacent the second lead such that a first gap is formed between the anode portion and the cathode portion, and a second gap is formed between the extension of the top portion of the first lead and the extension of the top portion of the second lead,
wherein the extension of the first lead includes an angling arm and a twistable support, the twistable support being attached to the wire-clasping portion of the first lead, and the extension of the second lead includes an angling arm and a twistable support, the twistable support being attached to the wire-clasping portion of the second lead, and
wherein the twistable support of the first lead and the twistable support of the second lead are twisted approximately 90 degrees such that a middle portion of the wire-clasping portion of the first lead forms a first plane that is substantially parallel to a second plane formed by a middle portion of the wire-clasping portion of the second lead.

16. The wire-clasping lead frame of claim 15, wherein the wire-clasping portion of the first lead and the wire-clasping portion of the second lead are substantially flat and define a common plane.

17. The wire-clasping lead frame of claim 15, wherein the wire-clasping portion of the first lead includes a middle portion, and the plurality of tabs of the wire-clasping portion of the first lead includes a bottom pair of tabs extending orthogonally from the middle portion and for clasping the insulation of the first wire.

18. The wire-clasping lead frame of claim 17, wherein the plurality of tabs of the wire-clasping portion of the first lead includes a middle pair of tabs extending orthogonally from the middle portion and for clasping the insulation and the conductor of the first wire.

19. The wire-clasping lead frame of claim 18, wherein the plurality of tabs of the wire-clasping portion of the first lead includes a top pair of tabs extending orthogonally from the middle portion and for contacting the conductor of the first wire.

20. A light-emitting diode (LED) illumination assembly, comprising: a wire-clasping LED lead frame including a first lead and a second lead, the first lead having a top portion affixed to a wire-clasping portion and the second lead having a top portion affixed to a wire-clasping portion; an LED chip mounted to, and in electrical connection with, the top portion of the first lead, and in electrical connection with the top portion of the second lead; a lens encapsulating a portion of the top portion of the first lead, and a portion of the top portion of the second lead and the LED chip; a first wire having an insulator and a conductor; and a second wire having an insulator and a conductor; wherein the wire-clasping portion of the first lead clasps the first wire to form a mechanical and electrical connection and the wire-clasping portion of the second lead clasps the second wire to form a mechanical and electrical connection to the second wire,
wherein the wire-clasping portion of the first lead includes a first pair of tabs contacting the conductor of the first wire and orthogonal to a middle portion of the wire-clasping portion of the first lead; and a second pair of tabs contacting both the conductor and insulator of the first wire.

21. The LED illumination assembly of claim 20, wherein the first lead and the second lead are twisted such that the wire-clasping portion of the first lead and the wire-clasping portion of the second lead are substantially opposite one another.

22. The LED illumination assembly of claim 20, further including a lampholder, the lampholder including a first slot receiving a pair of first tabs of the wire-clasping portion of the first lead, and a second slot receiving a pair of first tabs of the wire-clasping portion of the second lead.

23. The LED illumination assembly of claim 20, wherein at least a portion of each of the tabs of the second pair of tabs is bent towards a face of the wire-clasping portion of the first lead, and contacts the first conductor such that a bundle of individual strands of the first conductor is deformed, thereby increasing a contact surface area between the first conductor and the wire-clasping portion of the first lead.

* * * * *